(12) United States Patent
Yachareni et al.

(10) Patent No.: US 6,744,666 B1
(45) Date of Patent: Jun. 1, 2004

(54) METHOD AND SYSTEM TO MINIMIZE PAGE PROGRAMMING TIME FOR FLASH MEMORY DEVICES

(75) Inventors: Santosh Yachareni, San Jose, CA (US); Kazuhiro Kurihara, Sunnyvale, CA (US); Ming-Huei Shieh, Cupertino, CA (US); Pau-Ling Chen, Saratoga, CA (US)

(73) Assignees: Advanced Micro Devices, Inc., Sunnyvale, CA (US); Fujitsu Limited, Kanagawa-Ken (JP)

( * ) Notice: Subject to any disclaimer, the term of this patent is extended or adjusted under 35 U.S.C. 154(b) by 0 days.

(21) Appl. No.: 10/243,792

(22) Filed: Sep. 12, 2002

(51) Int. Cl.[7] ............................................. G11C 11/34
(52) U.S. Cl. ................... 365/185.12; 365/227
(58) Field of Search .............................. 365/185.12, 227

(56) References Cited

U.S. PATENT DOCUMENTS 6,373,748 B2 * 4/2002 Ikehashi et al. ....... 365/185.22
6,580,645 B1 * 6/2003 Lin et al. ............... 365/185.23

* cited by examiner

Primary Examiner—Michael Tran

(57) ABSTRACT

Embodiments of the present invention are directed to a method and system to minimize page programming time for page programmable memory devices. In one embodiment, the present invention comprises program logic that programs a page programmable memory device with a plurality of words during a page programming cycle and a detector coupled to the program logic that identifies a particular word in that plurality of words which does not require programming. When the detector identifies a particular word which does not require programming, it sends an indication to the program logic component which, in response to the signal, reduces the length of the page programming cycle.

20 Claims, 15 Drawing Sheets

METHOD AND SYSTEM TO MINIMIZE PAGE PROGRAMMING TIME FOR FLASH MEMORY DEVICES

TECHNICAL FIELD

The present invention relates to the field of semiconductor memory devices. More specifically, the present invention relates to page programming a flash memory device.

BACKGROUND ART

Flash random access memory (RAM), more commonly known as flash memory, is a form of non-volatile storage that uses a memory cell design with a floating gate. High voltages are applied to the memory cell inputs to program or store charge on the floating gate or remove charge from the floating gate. Programming occurs by hot electron transfer to place charge on the floating gate while erasure makes use of Fowler-Nordheim tunneling in which electrons pierce a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM).

Current trends in memory technology are toward high-speed access, high density, and lower voltages to save power. But, higher density and lower voltage tend to reduce performance in a standard random access memory architecture. Therefore, different architecturel approaches are being used to increase performance in Flash memories. One approach is called "Page Mode". A page is a small group of memory words that are accessed, internal to the memory, in parallel rather than one at a time. Page Mode interfaces increase the performance of Flash memory devices by storing a group of memory words in a Page buffer during an initial random data access.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 1.5 seconds. To erase an entire 64 MB density chip can take up to 60 seconds. While programming flash memory devices is usually faster, on the order to 7 to 300 microseconds, it is still slow compared to other memory devices. This is because these devices are typically programmed one 16-bit word at a time. Because of this, programming an entire chip can take up to 7 seconds (including the time to verify the data).

Occasionally during a page programming cycle, a particular word may not require programming Typically, the gates in a blank flash memory device are all open, giving each cell in the device a value of 1. When a cell is programmed, its value is set to 0. Thus, a word comprising all ones does not require programming and a programming pulse is not required for that word. However, currently there is no provision for shortening the programming pulse of words which do not require programming.

Thus, prior art methods for word programming flash memory devices are disadvantageous because of the amount of time required during programming. Specifically, programming one word at a time requires significant overhead such as performing program verification upon each word between word switching.

SUMMARY OF THE PRESENT INVENTION

In one embodiment, the present invention comprises program logic that programs a page programmable memory device with a plurality of words during a page programming cycle and a detector coupled to the program logic that identifies a particular word in that plurality of words which does not require programming. When the detector identifies a word which does not require programming, it sends an indication to the program logic component which, in response to the signal, reduces the length of the page programming cycle.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

MODES FOR CARRYING OUT THE INVENTION

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Embodiments of the present invention comprise a program control state machine for page programming a page programmable memory device. In accordance with embodiments of the present invention, the program control state machine programs 4-words during a page programming cycle. Furthermore, a zerobit detector is coupled with the program control state machine. The zerobit detector identifies words which are comprised entirely of ones and thus do not require programming. The zerobit detector indicates to the program control state machine that the word does not require programming and, in response to this indication, the program control state machine shortens the programming pulse for that word. In order to save time while programming, in embodiments of the present invention, there is no program verification between word switching as programming is done on 4 words or 64 bits at a time. Thus, in accordance with embodiments of the present invention, program verification is done in parallel on every 4 words, or 64 bits, using 64 sense amplifiers. This is achieved at no additional hardware cost as these same 64 bit sense amplifiers are used during page read.

Figure 1:
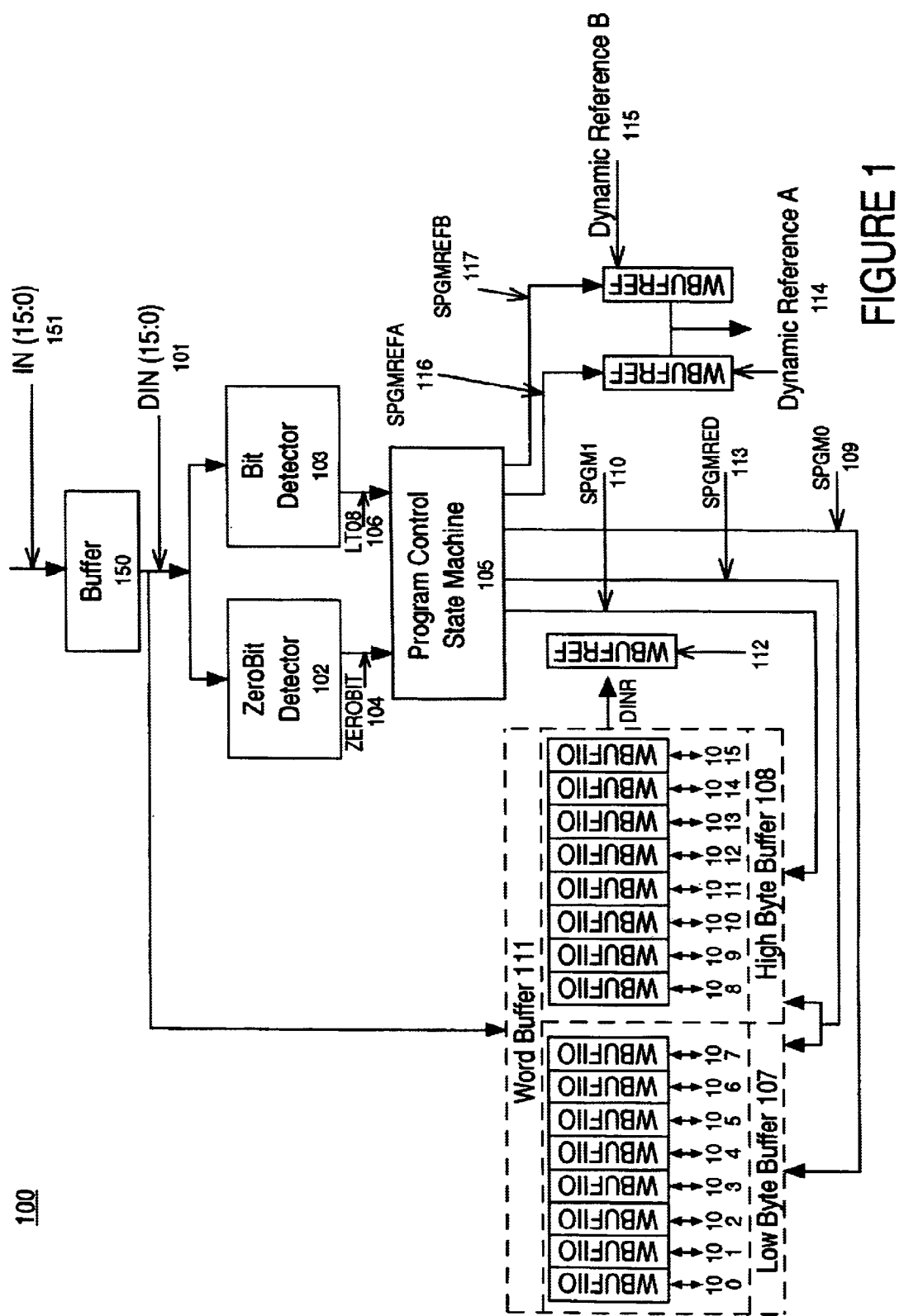
FIG. 1 is a block diagram of an exemplary system to minimize page programming time for a page programmable memory device in accordance with embodiments of the present invention.

FIG. 1 is a block diagram of an exemplary system 100 used to minimize the page programming time for a page programmable memory device in accordance with embodiments of the present invention. Data being programmed by system 100 is input to buffer 150 via line IN (15:0) 151. In one embodiment, IN (15:0) 151 is a 16-bit parallel data line which inputs 4 data words into buffer 151. In one embodiment, buffer 151 is comprised of 16 buffer cells, each of which can store 4 data bits. Buffer 150 is coupled with zerobit detector 102, bit detector 103, and word buffer 111 via data line DIN (15:0) 101. In embodiments of the present invention, DIN (15:0) 101 is a 16-bit parallel data line. In embodiments of the present invention, a single 16-bit word is sent from buffer 150 to zerobit detector 102, bit detector 103, and word buffer 111 4 times during a page programming cycle. Furthermore, in embodiments of the present invention, each of the buffer cells of buffer 150 is coupled with a buffer cell of word buffer 111 via DIN (15:0) 101. In embodiments of the present invention, each of the 16 buffer cells of word buffer 111 can also store 4 data bits. Thus during a page programming cycle, four 16-bit words can be programmed into word buffer 111 from buffer 150.

Zerobit detector 102 identifies words which do not require programming. For example, some words may be comprised entirely of "one" bits and therefore not require any programming. In accordance with embodiments of the present invention, zerobit detector 102 identifies these words and indicates to program control state machine 105 via zerobit line 104 that these words do not require programming. In response to this indication, program control state machine 105 terminates programming of those words and uses a shortened programming pulse for those words. This is advantageous because embodiments of the present invention do not waste an entire programming pulse on a word that does not require programming. A single 16-bit word is received via DIN (15:0) 101 into zerobit detector 102, and zerobit detector 102 determines whether that word requires programming.

In one embodiment of the present invention, the drain pump (not shown) of program control state machine 105 can only supply enough current to program 8 bits at a time. Bit detector 103 determines the number of bits that need to be programmed in a word and sends a signal via line LTQ8 (e.g., line 106 in FIG. 1) to program control state machine 105 indicating whether there are more than 8 bits in a given word that need to be programmed or less than 8 bits. For example, if there are less than 8 bits to be programmed in a given 16-bit word, bit detector 103 indicates this by sending a signal to program control state machine 105. In response to this signal, program control state machine 105 simultaneously programs the low byte buffer and the high byte-buffer (e.g., buffers 107 and 108 respectively) of word buffer 111. In one embodiment, this is accomplished by program control state machine 105 driving the signal on both of the set program lines (e.g., SPGM0 109 and SPGM1 110 of FIG. 1) high during the programming pulse. The set program lines govern the programming of their respective write buffers in word buffer 111. For example, in the embodiment of FIG. 1, SPGM0 109 governs the programming of low byte buffer 107 and SPGM1 110 governs the programming of high byte buffer 108. Thus, when one of the SPGM lines is driven high, its respective write buffer is receiving a programming byte for that programming pulse if one of the inputs from DIN (15:0) 101 to its corresponding WBUFIIO input is low.

In one embodiment, if there are more than 8 bits being programmed in a given word, bit detector 103 drives the signal on line 106 low. In response to this, program control state machine 105 utilizes 2 programming pulses to program the word. In one programming pulse, SPGM0 (line 109) is driven high while SPGM1 (line 110) is driven low. In response to this, only write buffer 107 is programmed during that programming pulse. In the next programming pulse, SPGM0 (line 109) is driven low and SPGM1 (line 110) is driven high. In response to this, only write buffer 108 is programmed during that programming pulse. At the end of the second programming pulse, the entire word has been programmed into word buffer 111.

In one embodiment of the present invention, write buffers 107 and 108 are each comprised of 8 buffer cells (e.g, IOs 0–15 of FIG. 1). Furthermore, in embodiments of the present invention, each of the buffer cells can hold four programming bits. A sequencer (not shown) in program control state machine 105 controls the word address sequence. In a typical page programming cycle, word 3 is sent to a first address line in word buffer 111, word 2 is sent to a second address line in word buffer 111, word 1 is sent to a third address line in word buffer 111, and finally word 0 is sent to a fourth address line in word buffer 111. This allows the present invention to program 4-words in a page programming cycle in contrast to prior art methods which typically programmed one word per programming cycle and then performed a 16 bit verification on that word.

In one embodiment, a write verification process is performed upon the 4 words while they are in word buffer 111. If a bit in a word passes the program verification, a latch in buffer 150 for that bit is reset. If a bit fails during the program verification, the latch in buffer 150 for that bit is not reset. If a bit fails verification, no new words are shifted into buffer 150 and the page programming cycle for those 4 words is repeated. However, during the subsequent page programming cycle, only the failed bits are programmed into word buffer 111 as the latches on the reset cells prevent those bits from being over programmed again during the page programming cycle. This prevents problems associated with over programming the bits which were successfully programmed during the previous cycle.

In one embodiment, redundancy is used and a redundancy buffer (e.g., WBUFRED 112 of FIG. 1) is used for storing a redundancy bit. For example, in one embodiment, one of the buffer cells of write buffers 107 or 108 will be disabled and SPGMRED line 113 is driven high. This permits writing the redundancy bit to redundancy buffer 112.

Additionally, in embodiments of the present invention, dynamic reference buffers A and B (e.g., dynamic reference A 114 and dynamic reference B 115 of FIG. 1) are programmed during a page programming cycle using lines SPGMREFA 116 and SPGMREFB 117 respectively. Typically, when a read operation is being performed, the current from the memory core cell is compared to the average of dynamic reference A 114 and dynamic reference B 115. If the current from the memory core cell is less than the average of dynamic references A and B, the bit is read as a "0" and if the current is greater than the average of dynamic references A and B, the bit is read as a "1".

Figure 2:
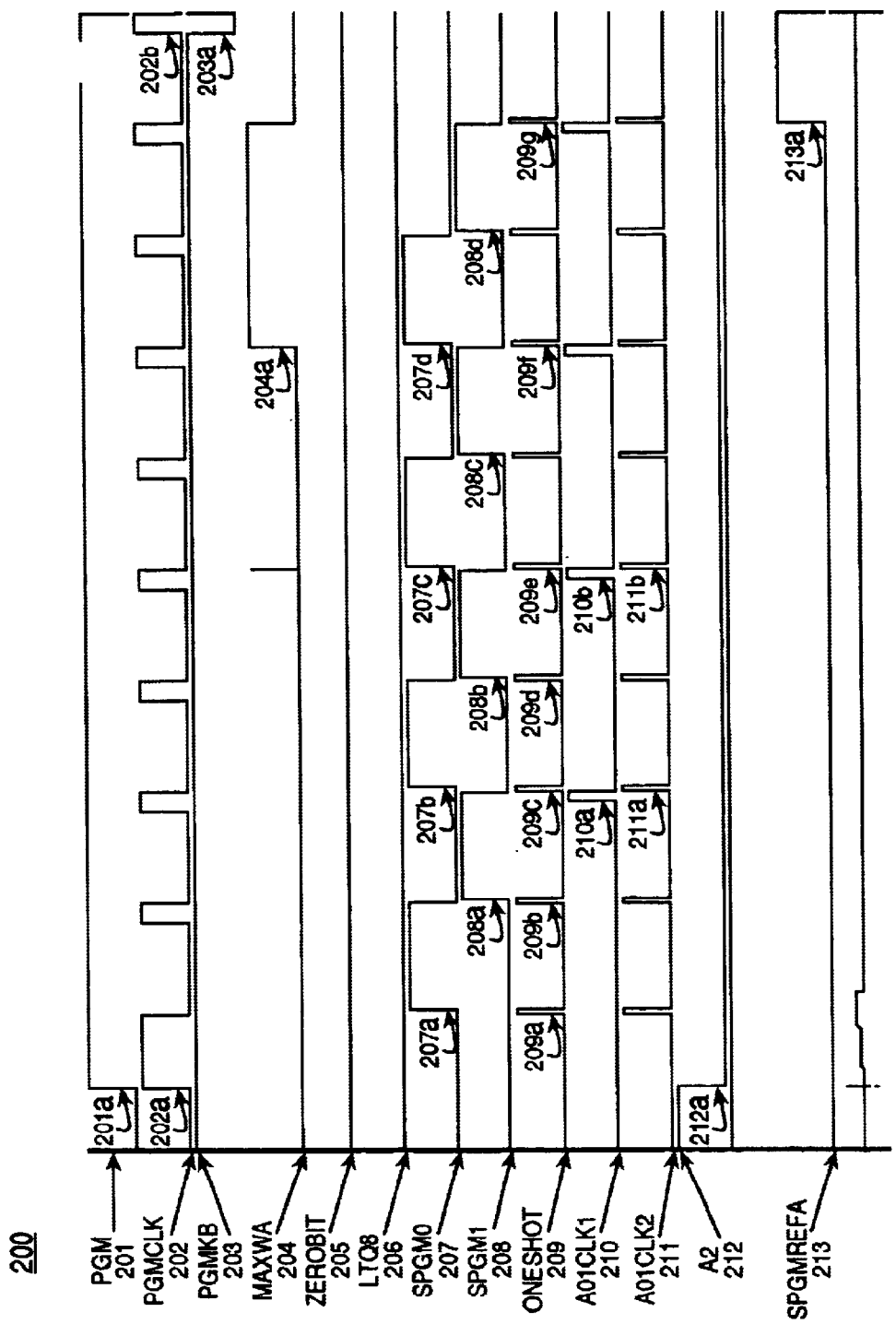
FIG. 2 shows a set of signals generated during an exemplary 4-word page programming cycle in accordance with embodiments of the present invention.

FIG. 2 shows a set of signals generated during an exemplary 4-word page programming cycle 200 in accordance with embodiments of the present invention. In one embodiment of the present invention, programming is always performed in the order: word 3, word 2, word 1, and word 0. PGM waveform 201 and PGMCLK waveform 202 initiate page programming cycle 200 when both are driven high (e.g., at points 201a and 202a respectively). For exemplary purposes it is assumed that all 4 words in cycle 200 require the programming of more than 8 bits; therefore, in the embodiment of FIG. 2, LTQ8 waveform 206 remains low throughout cycle 200. As mentioned above, LTQ8 is a signal generated by bit detector 103 of FIG. 1 which indicates to program control state machine 105 whether there are more or less than 8 bits to be programmed in a word. As a result of signal LTQ8 being low, two programming pulses are generated in succession to program a word. A first ONE-SHOT pulse (e.g., pulse 209a) then occurs. ONESHOT waveform 209 is driven by the system clock and is used to keep the programming pulses the same width. This is done by having a ONESHOT pulse before the first programming pulse and in between each of the subsequent programming pulses of the page programming cycle (e.g., pulses 209b, 209c, 209d. etc.). Additionally, ONESHOT waveform 209 is used to generate the clock signals A01CLK1 and A01CLK2 (e.g., waveforms 210 and 211 respectively) which facilitate cycling through word 3, word 2, word 1, and word 0 successively.

A01CLK1 and A01CLK2 are used to change the word addresses in word buffer 111 and to cause buffer 150 to send the next word in the sequence via DIN (15:0) 101. After first ONESHOT pulse 209a, word 3 is programmed into word buffer 111 and waveforms 210 and 211 go high at points 210a and 211a which causes the word address for word buffer 111 to change from word 3 to word 2. Buffer 150 sends the next word in the sequence (word 2) to zerobit detector 102 and bit detector 103. At points 210b and 211b, both waveforms again go high which causes the word address for word buffer 111 to change from word 2 to word 1 and word buffer 150 sends word 1 to zerobit detector 102 and bit detector 103.

In the embodiment of FIG. 2, zerobit signal 205 is low throughout page programming cycle 200. This indicates to program control state machine 105 that there are no words in this page programming cycle which do not require programming (e.g., no words comprising all one bits) and therefore, there are no shortened programming pulses in page programming cycle 200.

After ONESHOT pulse 209a, the SPGM0 signal (e.g, waveform 207) goes high at point 207a. The SPGM0 governs the low byte buffer (e.g., low byte buffer 107 of FIG. 1). In the embodiment of FIG. 2, the SPGM signals indicate which byte buffer of word buffer 111 is being programmed. During programming pulse 207a, which is defined by ONE-SHOT pulses 209a and 209b, signal SPGM0 goes high for one programming pulse and low byte buffer 107 is programmed. At ONESHOT pulse 209b, signal SPGM0 goes low which terminates the programming of the low byte of word 3. Then, during pulse 208a, which is defined by the time period between ONESHOT pulses 209b and 209c, the SPGM1 signal goes high for one programming pulse and high byte buffer 108, which is governed by the SPGM1 signal 208, is programmed. At ONESHOT pulse 209c, the SPGM1 signal goes low which terminates the programming of the high byte of word 3.

At this point, word 3 has been programmed into word buffer 111 and signals A01CLK1 210 and A01CLK2 211 cause the sequencer to change the word address in word buffer 111 to the word 2 address line and also cause buffer 150 to load the next word into zerobit detector 102 and bit detector 103. At ONESHOT pulse 209c, signal SPGM0 goes high again at pulse 207b which initiates the programming of the low byte for word 2. Words 2 and 1 are programmed in a manner similar to that describing the programming of word 3.

At ONESHOT pulse 209f, which initiates the programming of word 0, signal MAXWA 204 goes high at pulse 204a. This signal is initiated by the sequencer of program control state machine 105 and indicates that the last word in page programming cycle 200 is being programmed.

Signal SPGMREFA (e.g., signal 213) also goes high at this point. SPGMREFA governs the programming of dynamic reference A 114. In a previous program verification operation, prior to page programming cycle 200, dynamic reference A failed verification. For this reason, signal A2 212 is driven low at pulse 212a. This indicates that dynamic reference A 114 will be programmed during page programming cycle 200. In one embodiment of the present invention, the programming of dynamic reference A 114 occurs after the programming of word 0 because the drain pump can only supply enough current to program 8 bits at a time. Therefore, programming dynamic reference A 114 is performed after programming word buffer 111 in order to avoid programming more than 8 bits at any time.

At pulse 203a, signal PGMKB 203 goes low simultaneous to signal PGMCLK 202 going high at pulse 202b. This causes signal PGM 201 to go low which terminates page programming cycle 200.

Figure 3:
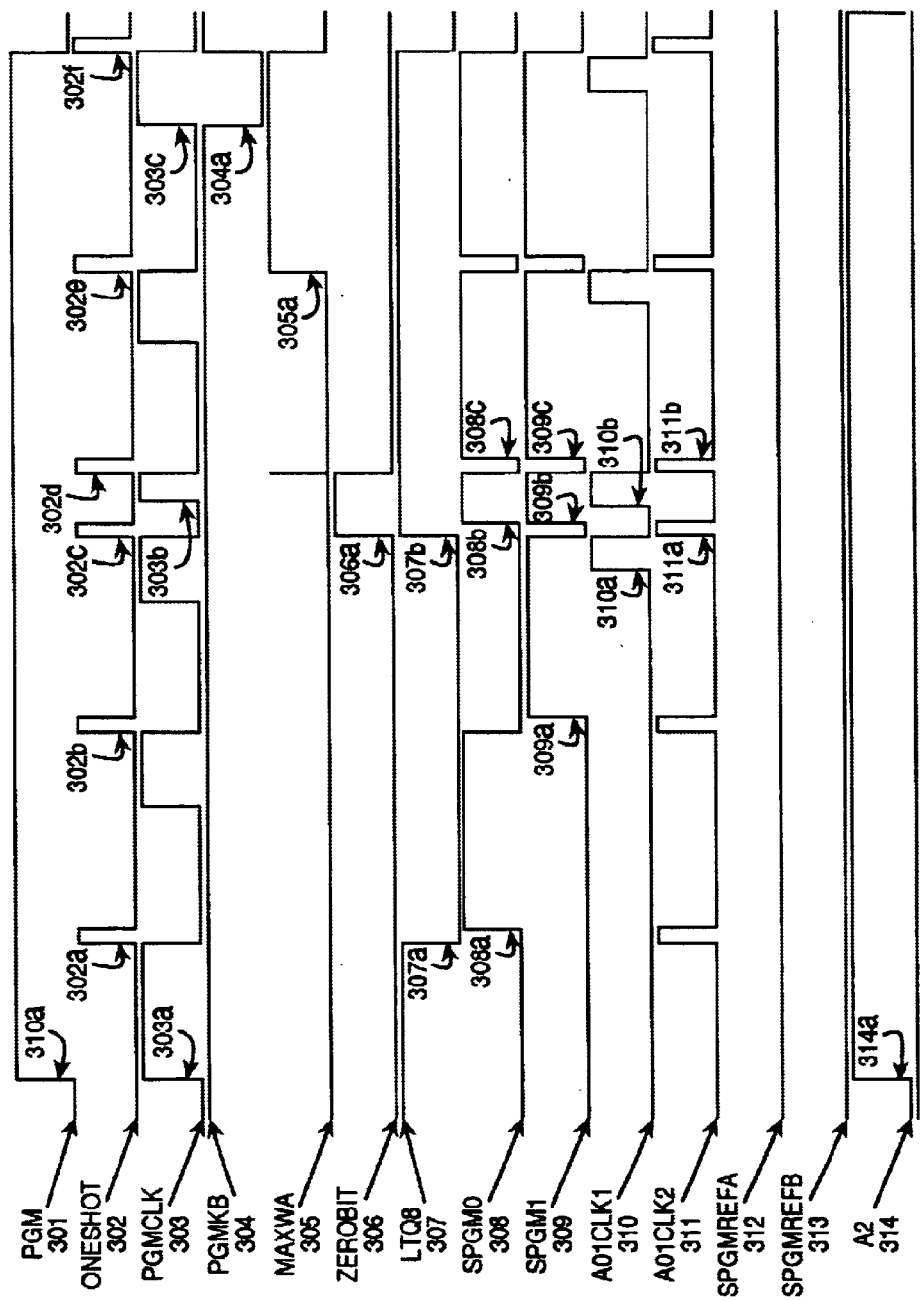
FIG. 3 shows another set of signals generated during an exemplary 4-word page programming cycle in accordance with embodiments of the present invention.

FIG. 3 shows another set of signals generated during an exemplary 4-word page programming cycle 300 in accordance with embodiments of the present invention. Page programming cycle 300 differs from page programming cycle 200 in a variety of ways. While the programming of word 3 is performed similarly in both page programming cycles, in page programming cycle 300 word 2 does not require programming and words 1 and 0 both require the programming of less than 8 bits.

As in page programming cycle 200, page programming cycle 300 is initiated when signal PGM 301 and PGMCLK 303 go high (at pulses 301a and 303a respectively). At ONESHOT pulse 302a, signal ZEROBIT 306 is low which indicates that word 3 requires programming and signal LTQ8 (e.g., signal 307 in FIG. 3) is low which indicates that word 3 requires the programming of more than 8 bits. Because signal LTQ8 307 is low at pulse 307a, signal SPGM0 308 goes high after ONESHOT pulse 302a (at pulse 308a) to initiate the programming of low byte buffer 107. At the end of the SPGM0 programming pulse, as defined by ONESHOT pulses 302a and 302b, signal SPGM0 goes low and signal SPGM1 309 (e.g., signal 309 in FIG. 3) goes high at pulse 309a. This initiates the programming of high byte buffer 108 for the programming pulse defined by ONE-SHOT pulses 302b and 302c.

At ONESHOT pulse 302c, programming of high byte buffer 108 is terminated and signal SPGM1 goes low. Additionally, signal A01CLK1 goes high at pulse 310a followed by signal A01CLK2 going high at pulse 311a. This causes the sequencer of program control state machine 105 to change the word address in word buffer 111 to the word line for word 2 and causes buffer 150 to send word 2 to zerobit detector 102 and bit detector 103. In the embodiment of FIG. 3, word 2 is comprised entirely of ones and, therefore, does not require any programming. Zerobit detector 102 identifies that word 2 does not require programming and indicates this to program control state machine 105 by driving signal ZEROBIT 306 high at pulse 306a. In response to signal ZEROBIT 306 going high at pulse 306a, program control state machine 105 only uses a single clock pulse (e.g., pulse 309b) from the back end of program control state machine 105 for word 2. Additionally, signal LTQ8 307 goes high at pulse 307b which indicates that less than 8 bits need to be programmed. In response to this, signals SPGM0 and SPGM1 go high simultaneously. In accordance with embodiments of the present invention, when less than 8 bits in a word need to be programmed, both low byte buffer 107 and high byte buffer 108 can be programmed simultaneously and therefore signals. SPGM0 and SPGM 1 go high simultaneously to cause both byte buffers to be programmed simultaneously. However, in word 2, no programming is performed as all of the inputs to word buffer 111 from DIN (15:0) 101 are high.

As shown in FIG. 3, a shorter clock pulse (e.g., pulse 303b) is generated for word 2. This is possible because word 2 does not require any programming and thus, does not require an entire programming pulse. This is novel because it utilizes shortened clock pulses for words which do not require programming Rather than waste an entire programming pulse on a word that does not require programming, the present invention uses a shorter clock cycle generated from the back end state machine. Because of the shortened clock pulse, signals A01CLK1 and A01CLK2 go high at pulses 310b and 311b, causing the sequencer of program control state machine 105 to change the word address in word buffer 111 to change to the word line for word 1 and to cause buffer 150 to send word 1 to zerobit detector 102 and bit detector 103.

In the embodiment of FIG. 3, there are less than 8 bits to be programmed in both word 1 and word 0. Therefore, signal LTQ8 remains high, indicating to program control state machine 105 that both low byte buffer 107 and high byte buffer 108 can be programmed simultaneously in both words. As stated above, in one embodiment of the present invention, the drain pump in the program logic circuit can only supply enough current to program 8 bits at a time. Because of this, the signals for both SPGM0 and SPGM 1 (e.g., signals 308 and 309 respectively in FIG. 3) go high and low byte buffer 107 and 108 are programmed simultaneously. As described above, the sequencer causes signal MAXWA 305 to go high at pulse 305a during the programming of word 0 to indicate the last word in the page programming cycle. Also, signal PGMKB 304 goes low at pulse 304a which causes signal PGM 301 to go low at pulse 301b and terminate page programming cycle 300.

As shown in FIG. 3, signal A2 314 (e.g., signal 314 of FIG. 3) goes high during page programming cycle 300 at pulse 314a which indicates that the programming of the dynamic reference cells was successfully verified prior to page programming cycle 300 and, therefore, no programming of the dynamic reference cells will occur during page programming cycle 300. For this reason signals SPGM-REFA 312 and SPGMREFB 313 remain low throughout page programming cycle 300.

At pulse 304a, signal PGMKB 304 goes low simultaneous to signal PGMCLK 303 going high at pulse 303c. This causes signal PGM to go low which terminates page programming cycle 300.

Thus, the present invention provides a system which minimizes the page programming time for a page programmable memory device. Utilizing a zerobit detector (e.g., zerobit detector 102 of FIG. 1) is novel because the present invention does not utilize an entire programming pulse for words which do not require programming, therefore saving significant time in a page programming cycle. This is especially apparent when a program verification process fails and a bit requires re-writing in a subsequent page programming cycle.

Figure 4:
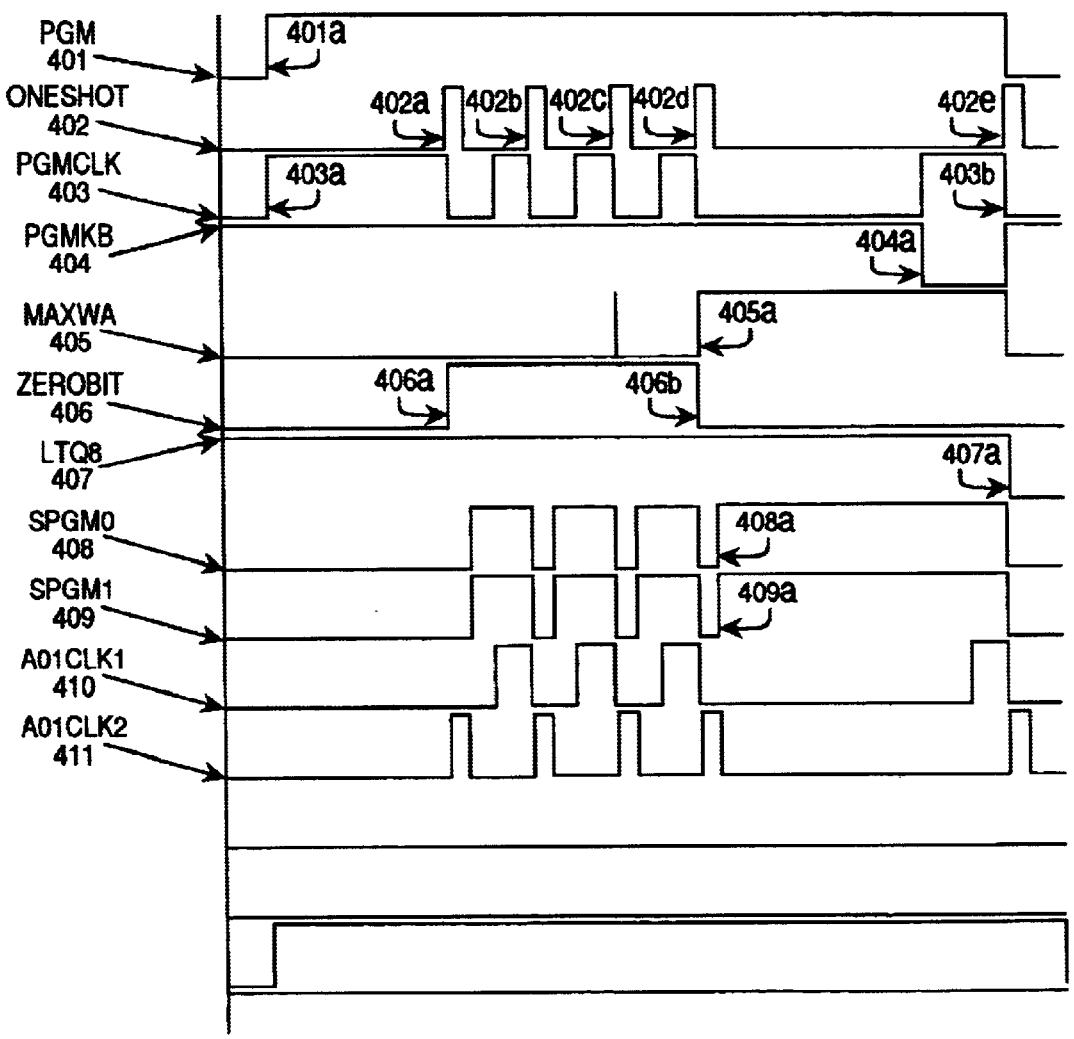
FIG. 4 shows a set of signals generated during an exemplary re-write page programming cycle in accordance with embodiments of the present invention.

FIG. 4 shows a set of signals generated during an exemplary re-write page programming cycle 400 in accordance with embodiments of the present invention. In the embodiment of FIG. 4, word 0 has failed program verification from a previous page programming cycle (e.g., page programming cycle 300 of FIG. 3). In the embodiment of FIG. 4, word 0 requires re-writing of 8 or less bits. It is appreciated that FIGS. 3 and 4 are drawn to the same scale.

As described above, a write verification process is performed upon the 4 words while they are in word buffer 111. If a bit in a word passes the program verification, a latch for that bit is reset in buffer 150. If a bit fails during the program verification, the latch for that bit is not reset in buffer 150. If a bit fails verification, no new words are shifted into buffer 150 and the page programming cycle for those 4 words is repeated. However, during the subsequent page programming cycle, only the failed bits are programmed into word buffer 111 as the latches on the reset cells prevent those bits from being programmed again during that page programming cycle. This prevents problems associated with over programming of bits which were successfully programmed during the previous cycle.

Page programming cycle 400 is initiated when signals PGM 401 and PGMCLK 403 go high (at pulses 401a and 403a respectively). When signal ONESHOT 402 goes high at pulse 402a signal ZEROBIT 406 goes high at pulse 406a. This indicates to program control state machine 105 that zerobit detector 102 has identified words which do not require programming. In the embodiment of FIG. 4, word 3, word 2, and word 1 do not require programming because they successfully passed program. Therefore, ZEROBIT signal 406 goes high at pulse 406a. Additionally, as there are less than 8 bits to be programmed in each word of page programming cycle 400, signal LTQ8 (e.g., signal 407 of FIG. 4) remains high throughout the page programming cycle. Because of this, signals SPGM0 and SPGM1 go high simultaneously throughout page programming cycle 400. However, because ZEROBIT signal 406 is also high, no programming of word buffer occurs during the programming pulses for word 3, word 2, and word 1.

In the embodiment of FIG. 4, program control state machine 105 generates shortened clock cycles for words 3, 2, and 1 in response to ZEROBIT signal 406 remaining high in the time period defined by ONESHOT pulses 402a–402d. As described above, programming on those words is terminated and only one clock cycle from the back end of the state machine is used rather than an entire programming pulse. When word 0 is loaded into zerobit detector 102 at pulse 402d, the ZEROBIT signal 406 goes low to indicate that word 0 requires programming. Because signal LTQ8 remains high, signals SPGM0 and SPGM1 arm simultaneously driven high at pulses 408a and 409a respectively. Word buffer 111 is then rewritten with the bits from word 0 that failed program verification in the previous page programming cycle.

Signal MAXWA 405 goes high at pulse 405a to indicate the last word to be programmed in page programming cycle 400. The sequencer of program control state machine 105 causes signal MAXWA 405 to go high during the programming of word 0 to indicate the last word in the page programming cycle. Also, signal PGMKB 404 goes low at pulse 404a at the same time PGMCLK goes high at pulse 403b which causes signal PGM 401 to go low at pulse 401b and terminate page programming cycle 400.

Figure 5:
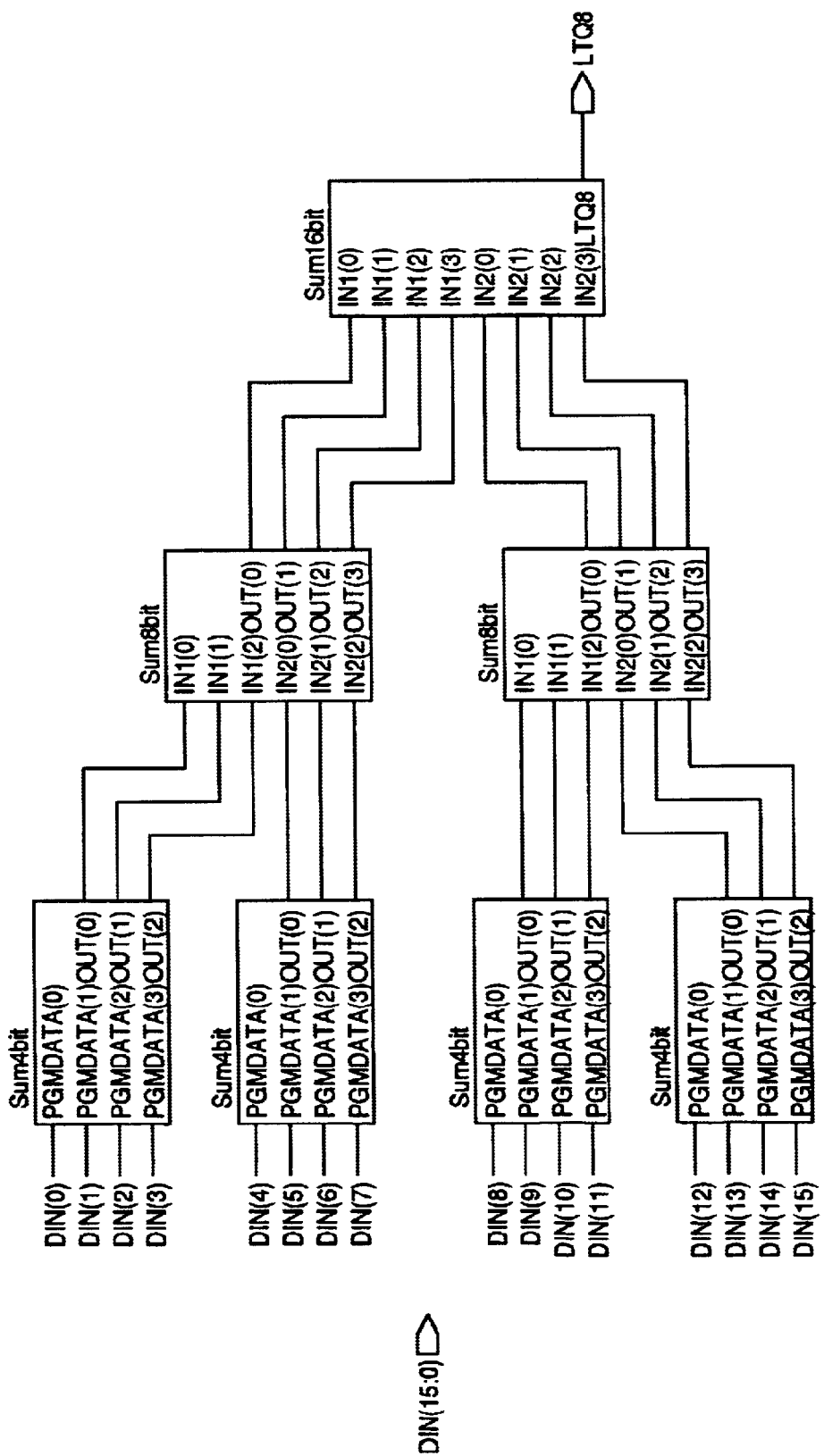
FIG. 5 is an exemplary logic diagram of a bit detector used in accordance with embodiments of the present invention.

FIG. 5 is an exemplary logic diagram of a bit detector (e.g., bit detector 103 of FIG. 1) used in accordance with embodiments of the present invention. Bit detector 103 identifies words which require the programming of 8 bits or less and sends an indication to program control state machine 105. When a word requires the programming of less than 8 bits, program control state machine 105 can program low byte buffer 107 and high byte buffer 108 simultaneously in response to the signal from bit detector 103. When a word requires the programming of more than 8 bits, low byte buffer 107 and high byte buffer 108 are successively programmed.

Figure 6:
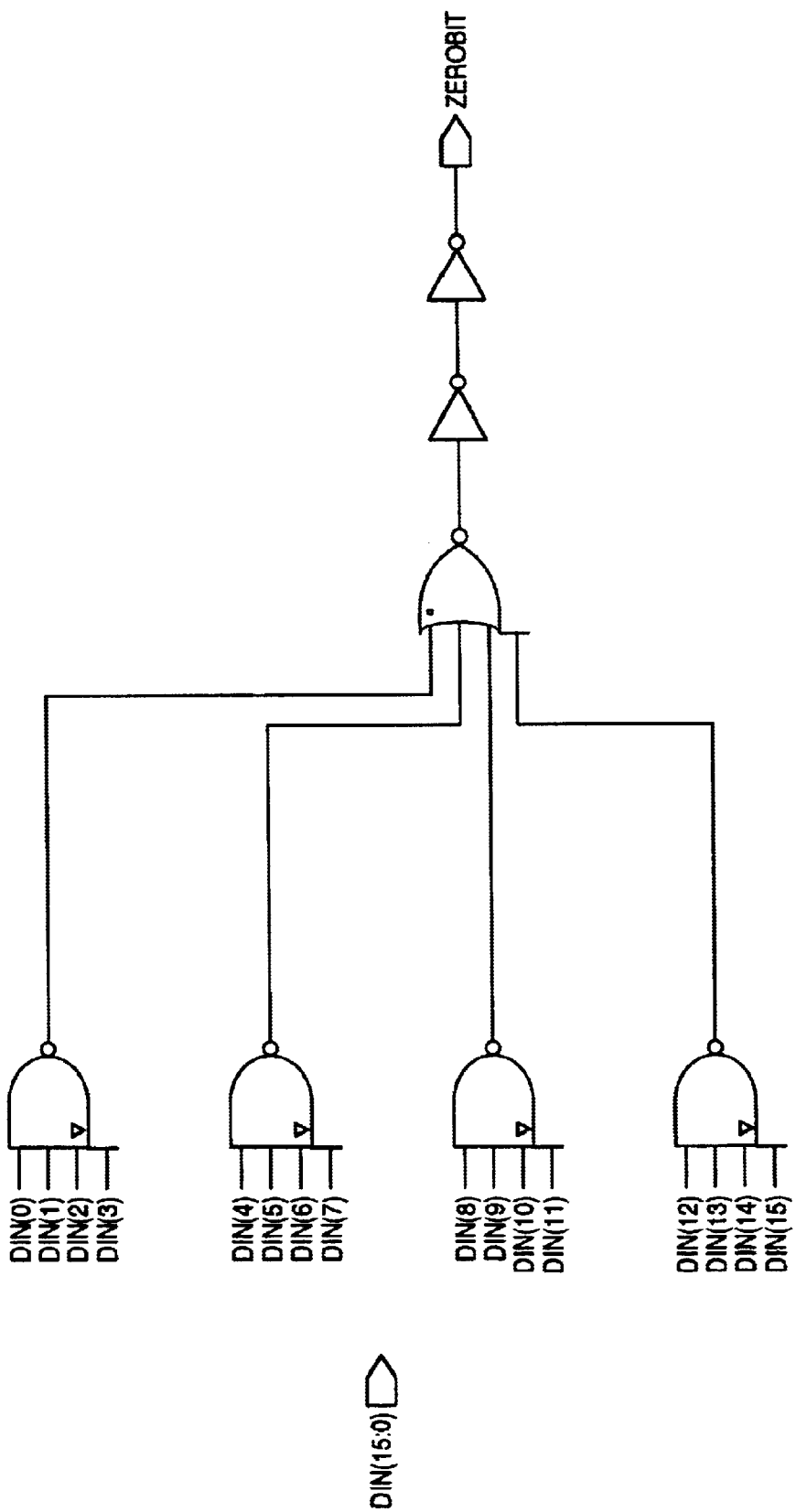
FIG. 6 is an exemplary logic diagram of a "zerobit" detector utilized in accordance with embodiments of the present invention.

FIG. 6 is an exemplary logic diagram of a detector component (e.g., zerobit detector 102 of FIG. 1) utilized in accordance with embodiments of the present invention. Zerobit detector 102 is used to identify words which do not require programming and for sending an indication to program control state machine 105. In response to this indication, program control state machine 105 uses a shortened clock cycle for those words identified by zerobit detector 102 which do not require programming.

Figures 1, 7A:
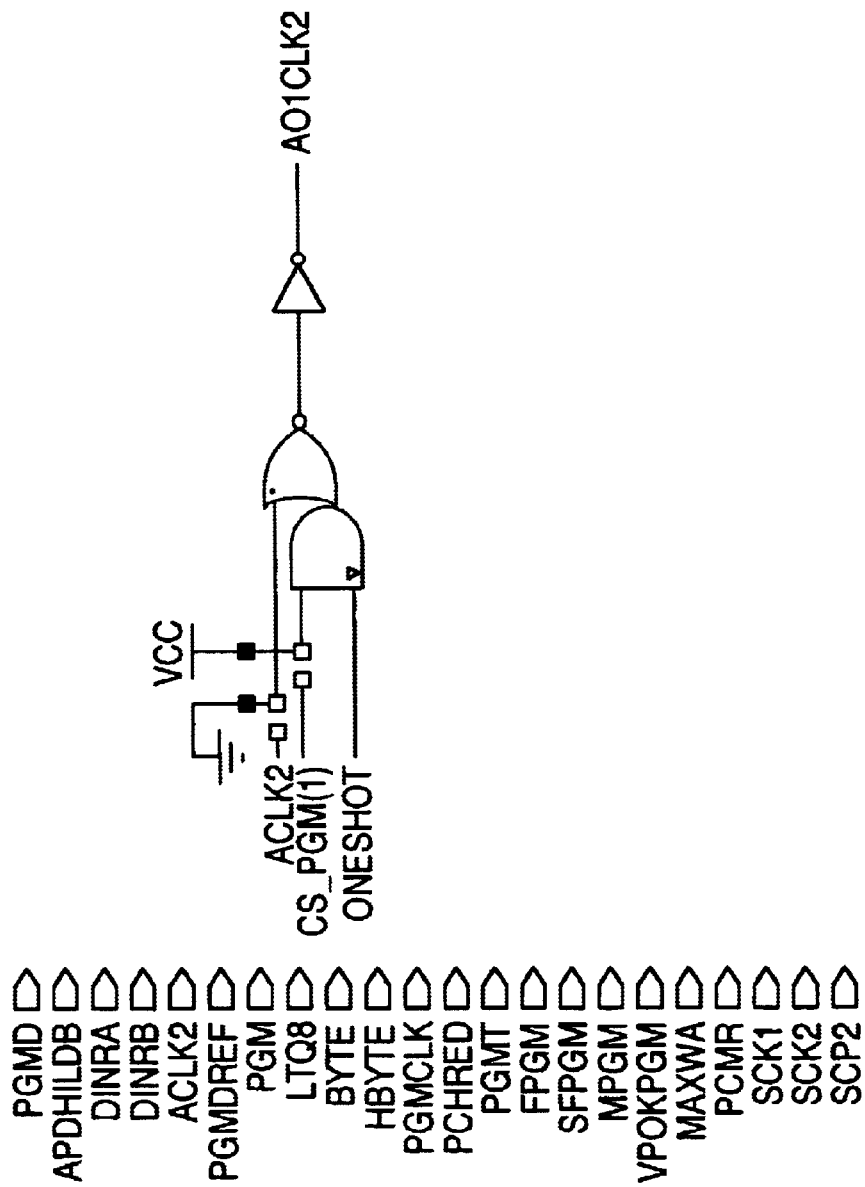
FIGS. 7A, 7B, and 7C are exemplary logic diagrams of a program control state machine utilized in accordance with embodiments of the present invention.
Figures 2, 7A:
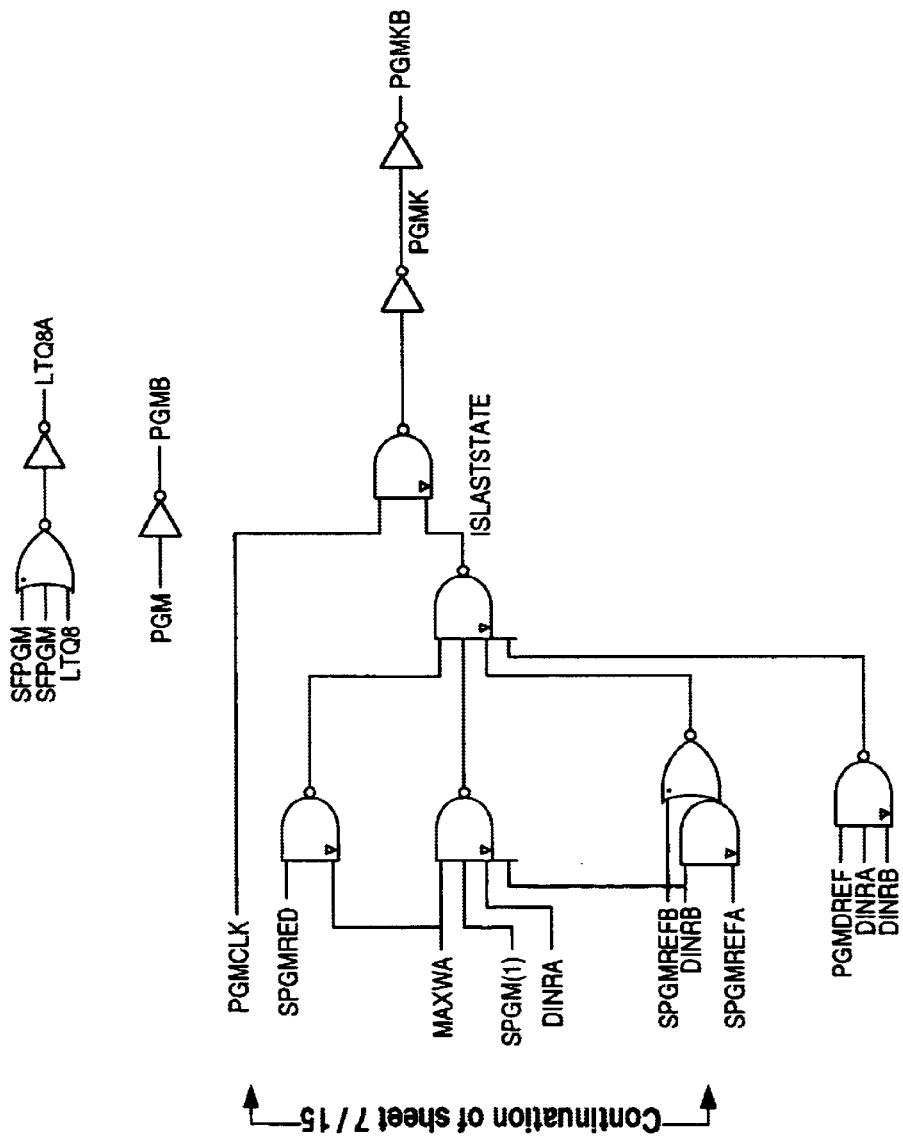
Figures 3, 7A:
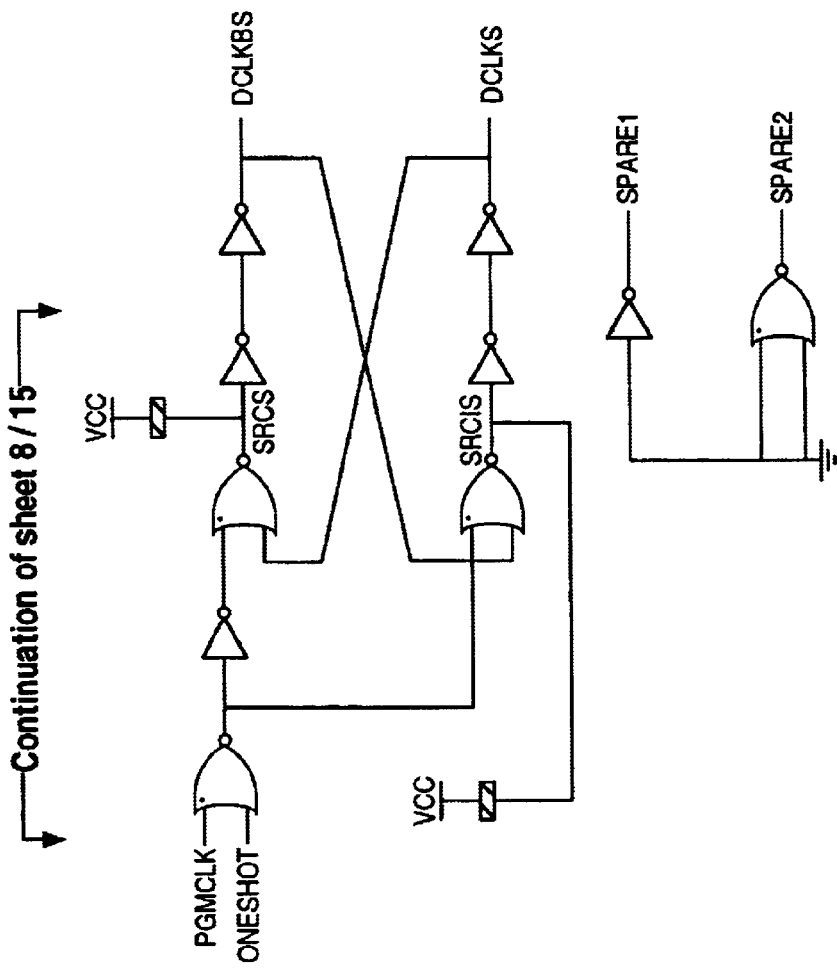
Figures 1, 7B:
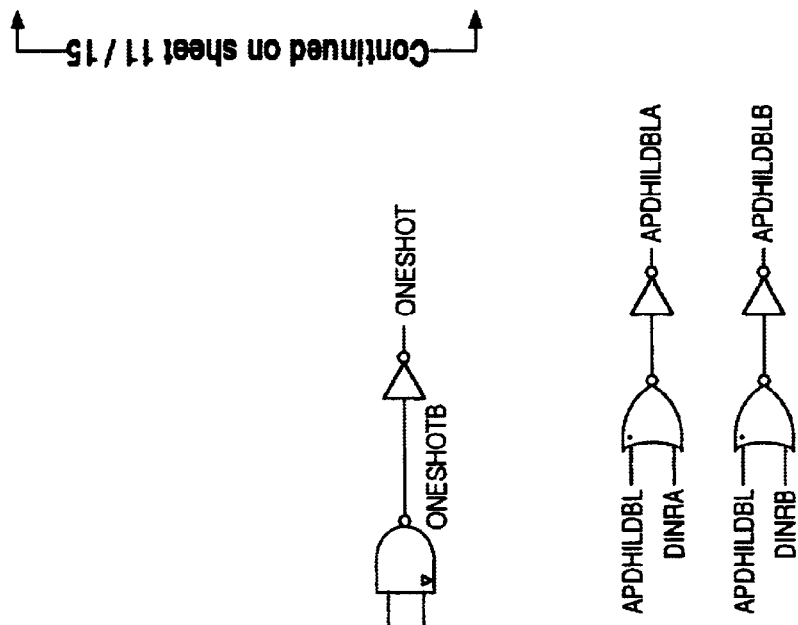
Figures 2, 7B:
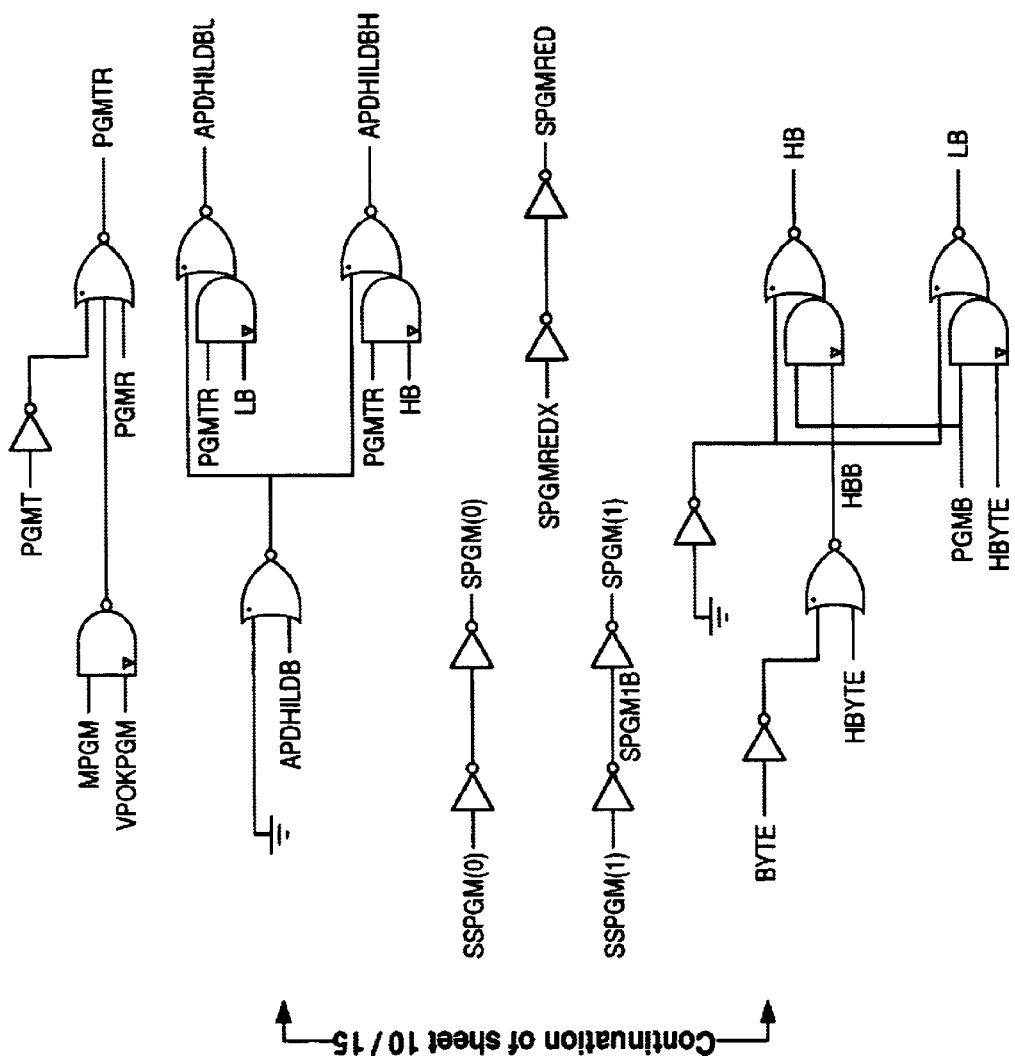
Figures 1, 7C:
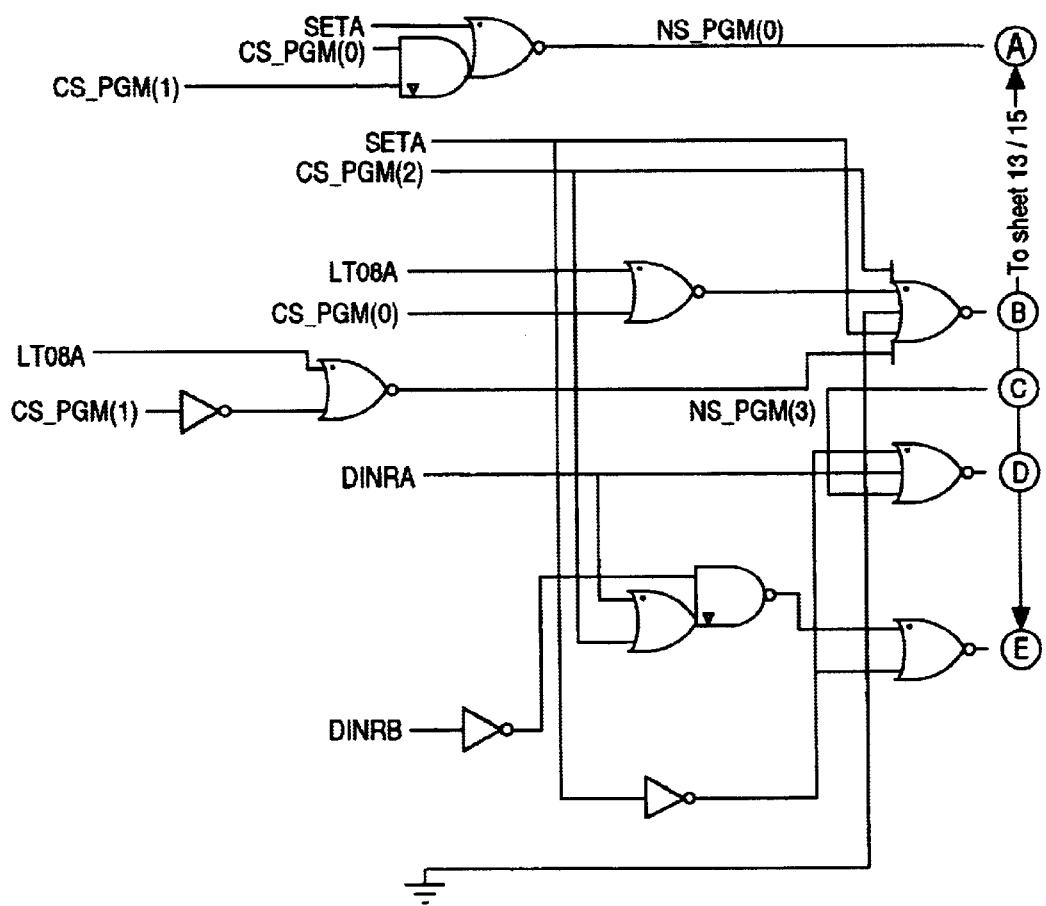
Figures 2, 7C:
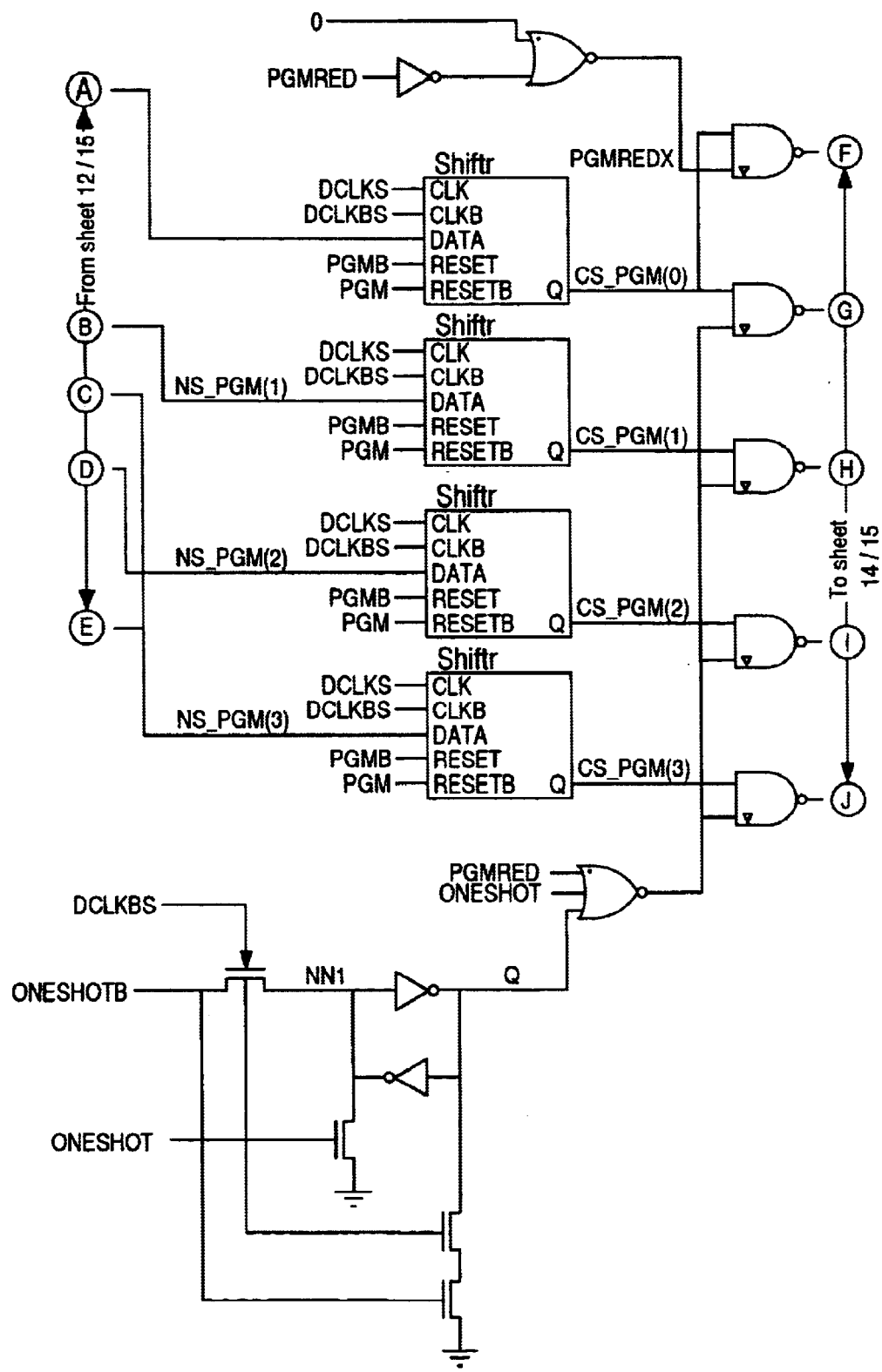
Figures 3, 7C:
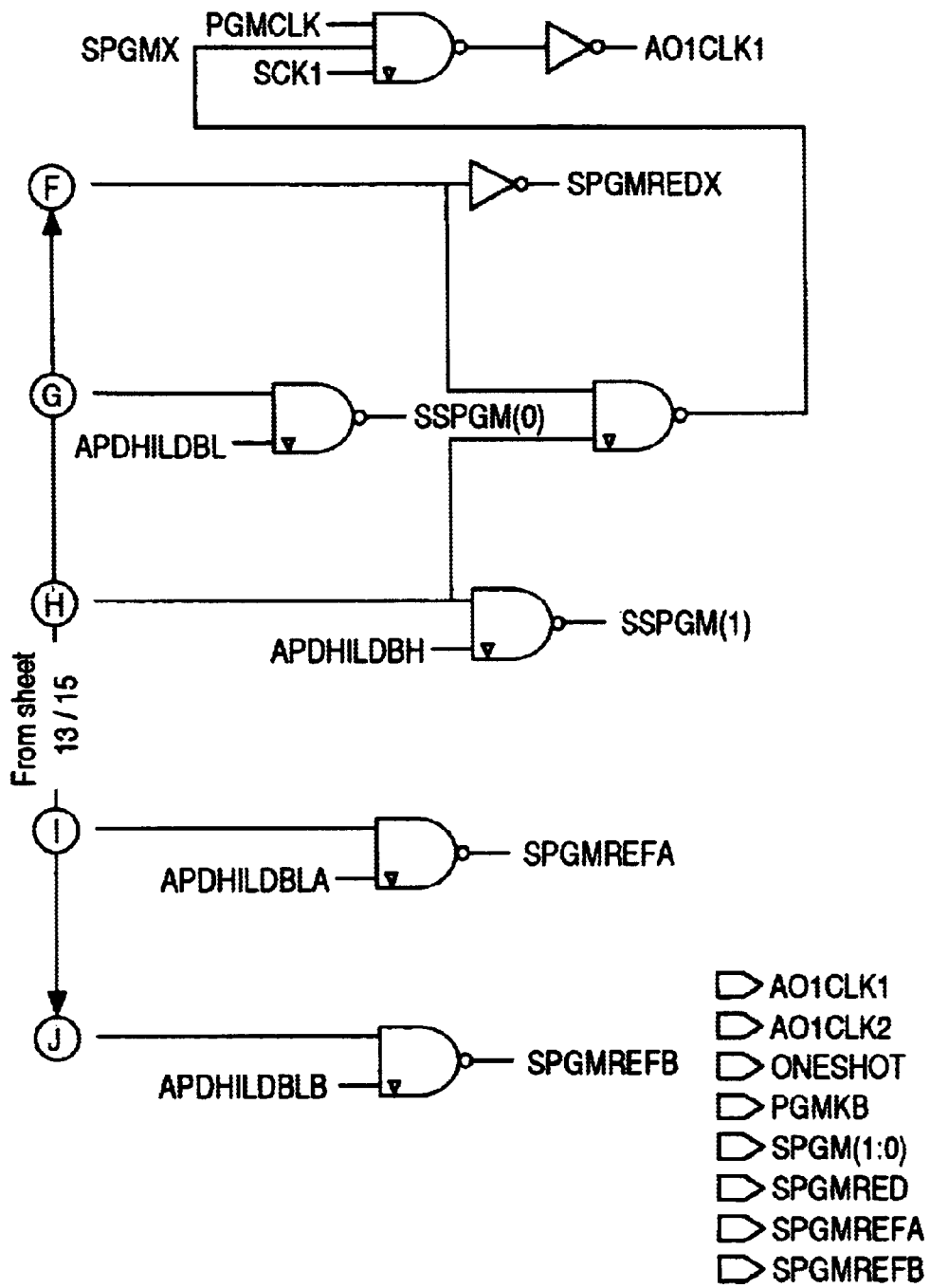

FIGS. 7A, 7B, and 7C are exemplary logic diagrams of a program logic component (e.g., program control state machine 105 of FIG. 1) utilized in accordance with embodiments of the present invention. In embodiments of the present invention, 4-word page read logic is utilized in program control stale machine 105. This facilitates faster programming than prior art methods which performed program verification after programming a single word.

Figure 8:
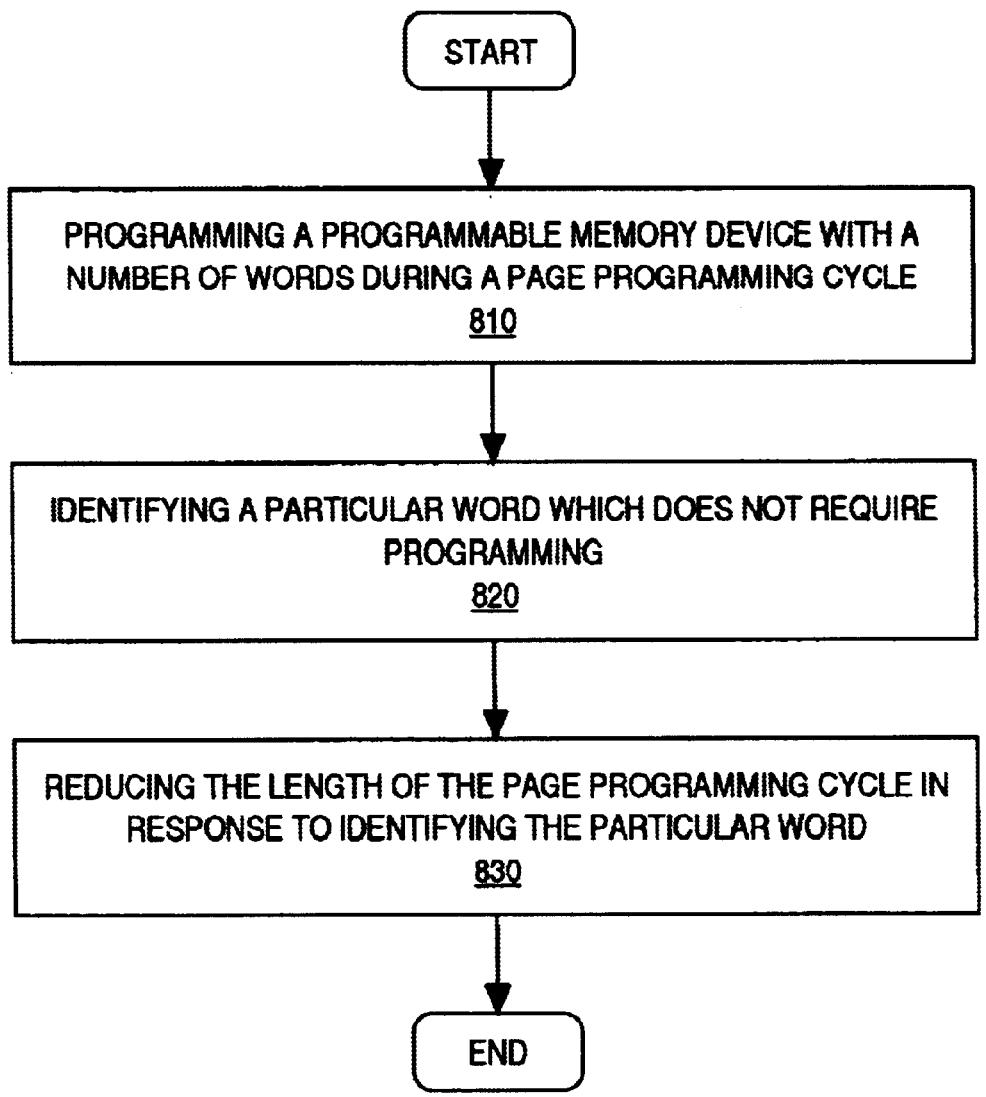
FIG. 8 is a flow chart of a method for minimizing the page programming time of page programmable memory devices in accordance with embodiments of the present invention.

FIG. 8 is a flow chart of a method 800 for minimizing the programming time of page programmable memory devices in accordance with embodiments of the present invention. In step 810 of FIG. 8, a page programmable memory device is programmed with a number of words during a page programming cycle. In one embodiment of the present invention, a program logic component (e.g., program control state machine 105 of FIG. 1) programs a page programmable memory device with a plurality of words during a page programming cycle. In one embodiment, the page programmable memory device is a flash memory device. In one embodiment, program control state machine 105 utilizes 4-word page read logic to program a page programmable flash memory device with 4 words in a page programming cycle.

In step 820 of FIG. 8, a particular word which does not require programming is identified. In accordance with embodiments of the present invention, a detecting component (e.g., zerobit detector 102 of: FIG. 1) identifies words which do not require programming. For example, in a typical flash memory device, a word comprised entirely of "one" bits does not require programming. In embodiments of the present invention, zerobit detector 102 identifies words which do not require programming and indicates to program control state machine 105 that those particular words do not require programming.

In step 830 of FIG. 8, the length of the page programming cycle is reduced in response to identifying the particular word. In embodiments of the present invention, program control state machine 105, in response to receiving an indication from zerobit detector 102, shortens the page programming cycle. In one embodiment, the programming pulse of the particular word which does not require programming is reduced. For example, in one embodiment programming of the particular word which does not require programming is terminated and program control state machine 105 uses a single clock cycle from the back end state machine instead of an entire programming pulse for that word.

The preferred embodiment of the present invention, a method and system to minimize page programming time for flash memory devices, is thus described. While the present invention has been described in particular embodiments, It should be appreciated that the present invention should not be construed as limited by such embodiments, but rather construed according to the following claims.

What is claimed is:

1. A system to minimize page programming time for a page programmable memory device comprising:
   program logic that programs said page programmable memory device with a plurality of words during a page programming cycle; and
   a detector coupled to the program logic that identifies a particular word of said plurality of words which does not require programming and indicates to said program logic component to reduce the length of said page programming cycle in response to said determining.

2. The system as described in claim 1, wherein said program logic programs said page with 4 words during said page programming cycle.

3. The system as described in claim 1, wherein said detector indicates to said program logic that said particular word does not require programming.

4. The system as described in claim 3, wherein said program logic does not utilize an entire programming pulse of said page programming cycle for said particular word in response to said indicating.

5. The system as described in claim 1, wherein said page programmable memory device is a flash memory device.

6. The system as described in claim 1, wherein a 4-word program verification process is performed upon said plurality of words after said page programming cycle.

7. The system as described in claim 6, wherein said program logic utilizes 4-word page read logic during said page programming cycle.

8. A method for minimizing page programming time for a page programmable memory device comprising:
   programming said page programmable memory device with a plurality of words during a page programming cycle using a program logic component;
   identifying a particular word of said plurality of words which does not require programming; and
   reducing the length of said page programming cycle in response to said identifying of said particular word.

9. The method for minimizing page programming time for a page programmable memory device as recited in claim 8, wherein said page programming comprises programming said page programmable memory device with 4 words during said page programming cycle.

10. The method for minimizing page programming time for a page programmable memory device as recited in claim 8, wherein said identifying comprises using a detecting component coupled to said programming component to identify said particular word.

11. The method for minimizing page programming time for a page programmable memory device as recited in claim 10, further comprising said detecting component indicating to said program logic component that said particular word does not require programming.

12. The method for minimizing page programming time for a page programmable memory device as recited in claim 11, wherein said reducing the length of said page programming cycle comprises utilizing a shortened programming pulse for said particular word in response to said indicating.

13. The method for minimizing page programming time for a page programmable memory device as recited in claim 8, wherein said page programmable memory device is a flash memory device.

14. The method for minimizing page programming time for a page programmable memory device as recited in claim 8, further comprising performing a 4-word verification process upon said plurality of words after said page programming cycle.

15. The method for minimizing page programming time for a page programmable memory device as recited in claim 8, further comprising utilizing 4-word page read logic during said page programming cycle.

16. A method for minimizing page programming time for a flash memory device comprising:
   utilizing 4-word page read logic to program said flash memory device with a plurality of words during a page programming cycle;
   identifying a particular word of said plurality of words which does not require programming; and
   reducing the length of said page programming cycle.

17. The method for minimizing page programming time for a flash memory device as recited in claim 16, wherein said identifying further comprises utilizing a detector coupled to said 4-word page read logic to identify said particular word.

18. The method for minimizing page programming time for a flash memory device as recited in claim 17, wherein said detector sends a signal to 4-word page read logic and comprising reducing the length of said page programming cycle in response to said signal.

19. The method for minimizing page programming time for a flash memory device as recited in claim 18, further comprising utilizing a shortened programming pulse for said particular word.

20. The method for minimizing page programming time for a flash memory device as recited in claim 16, further comprising performing a 4-word program verification process upon said plurality of words after said page programming cycle.

* * * * *